(12) United States Patent
Gao et al.

(10) Patent No.: US 11,394,003 B2
(45) Date of Patent: Jul. 19, 2022

(54) COVER PLATE, DISPLAY PANEL, DISPLAY DEVICE AND METHOD FOR ENCAPSULATING DISPLAY PANEL

(71) Applicant: BOE Technology Group Co., Ltd., Beijing (CN)

(72) Inventors: Xinwei Gao, Beijing (CN); Dandan Zang, Beijing (CN); Peng Li, Beijing (CN); Qihe Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 16/938,485

(22) Filed: Jul. 24, 2020

(65) Prior Publication Data
US 2021/0043867 A1    Feb. 11, 2021

(30) Foreign Application Priority Data

Aug. 7, 2019 (CN) .......................... 201910726486.X

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 51/525* (2013.01); *H01L 51/5259* (2013.01); *H01L 51/56* (2013.01)

(58) Field of Classification Search
CPC .............. H01L 51/5246; H01L 51/5259; H01L 51/525
See application file for complete search history.

(56) References Cited

U.S. PATENT DOCUMENTS

| | | | |
|---|---|---|---|
| 6,081,071 A * | 6/2000 | Rogers | H05B 33/04 313/512 |
| 6,896,572 B2 * | 5/2005 | Park | H01L 51/5246 445/25 |

(Continued)

FOREIGN PATENT DOCUMENTS

| CN | 1950476 A | 4/2007 |
|---|---|---|
| CN | 103325953 A | 9/2013 |

(Continued)

OTHER PUBLICATIONS

Machine translation, Lyu, Chinese Pat. Pub. No. CN 106784376A, translation date: Sep. 22, 2021, Espacenet, all pages. (Year: 2021).*

(Continued)

*Primary Examiner* — Victoria K. Hall
(74) *Attorney, Agent, or Firm* — Nath, Goldberg & Meyer; Joshua B. Goldberg

(57) ABSTRACT

The present disclosure provides a cover plate for encapsulating a display substrate, a display panel including the cover plate, a display device including the display panel and a method for encapsulating the display panel. The cover plate includes: a base substrate including a display area and an encapsulation area arranged at a periphery of the display area; and an encapsulation layer, a first barrier layer, a water absorption layer and a second barrier layer successively arranged in the encapsulation area of the base substrate in a direction from the display area to the encapsulation area.

9 Claims, 2 Drawing Sheets

(56) References Cited

U.S. PATENT DOCUMENTS

| | | | | |
|---|---|---|---|---|
| 7,671,959 | B2* | 3/2010 | Koo | H01L 51/5246 349/153 |
| 7,834,550 | B2* | 11/2010 | Lee | H01L 51/5246 313/512 |
| 7,948,178 | B2* | 5/2011 | Cok | H01L 23/10 313/512 |
| 8,063,561 | B2* | 11/2011 | Choi | H01L 51/5246 313/512 |
| 8,258,696 | B2* | 9/2012 | Oh | H01L 51/5246 |
| 8,319,355 | B2* | 11/2012 | Shih | C09D 163/00 257/789 |
| 8,357,929 | B2* | 1/2013 | Ryu | H01L 51/525 257/40 |
| 8,803,162 | B2* | 8/2014 | Lee | H01L 51/5237 257/79 |
| 9,076,985 | B2* | 7/2015 | Sakamoto | H01L 51/5253 |
| 9,570,704 | B2* | 2/2017 | Yang | H01L 51/5246 |
| 9,625,764 | B2* | 4/2017 | Yamazaki | G02F 1/1368 |
| 9,799,854 | B2* | 10/2017 | Ramadas | H01L 51/5256 |
| 10,283,730 | B2* | 5/2019 | Kuang | H01L 51/5246 |
| 10,290,828 | B2* | 5/2019 | Li | H01L 51/5253 |
| 10,454,061 | B2* | 10/2019 | Jo | H01L 51/5259 |
| 10,937,844 | B2* | 3/2021 | Kim | H01L 27/3246 |
| 2003/0122476 | A1* | 7/2003 | Wang | H05B 33/04 313/493 |
| 2004/0150319 | A1* | 8/2004 | Tomimatsu | H01L 51/525 313/495 |
| 2005/0052342 | A1* | 3/2005 | Wu | H01L 51/5259 345/4 |
| 2007/0172971 | A1* | 7/2007 | Boroson | H01L 51/5259 438/26 |
| 2008/0143247 | A1* | 6/2008 | Kim | C03C 8/24 313/504 |
| 2009/0009046 | A1* | 1/2009 | Oh | H01L 51/5246 313/1 |
| 2009/0261719 | A1* | 10/2009 | Nimura | H01L 51/5246 313/504 |
| 2010/0045181 | A1* | 2/2010 | Oh | H01L 33/005 313/512 |
| 2010/0215929 | A1* | 8/2010 | Seo | H01L 51/5253 428/213 |
| 2011/0133213 | A1* | 6/2011 | Lee | H01L 51/5246 257/79 |
| 2012/0112212 | A1* | 5/2012 | Kim | H01L 51/5246 257/88 |
| 2012/0169229 | A1* | 7/2012 | You | H01L 51/5253 315/51 |
| 2013/0048967 | A1* | 2/2013 | Nishido | H05B 33/04 257/40 |
| 2014/0311668 | A1* | 10/2014 | Yanagi | H01L 51/5259 156/273.7 |
| 2014/0319998 | A1* | 10/2014 | Han | H05B 33/04 313/504 |
| 2014/0346476 | A1* | 11/2014 | Yao | H01L 51/5253 257/40 |
| 2015/0028307 | A1* | 1/2015 | Kim | H01L 51/525 257/40 |
| 2015/0048330 | A1* | 2/2015 | Kang | H01L 51/5225 257/40 |
| 2015/0250032 | A1* | 9/2015 | Han | H01L 51/5237 313/504 |
| 2015/0349288 | A1* | 12/2015 | Luo | H01L 51/56 257/99 |
| 2015/0372254 | A1* | 12/2015 | Shin | H01L 51/5246 257/40 |
| 2016/0204379 | A1* | 7/2016 | Chen | B32B 27/286 428/219 |
| 2016/0226027 | A1* | 8/2016 | Horikawa | H01L 51/5246 |
| 2016/0248040 | A1* | 8/2016 | Liu | H01L 51/5246 |
| 2016/0254480 | A1* | 9/2016 | Yang | H01L 51/0034 257/40 |
| 2016/0343976 | A1* | 11/2016 | Zeng | H01L 51/56 |
| 2016/0343977 | A1* | 11/2016 | Zeng | H01L 51/5259 |
| 2016/0343982 | A1* | 11/2016 | Kim | H01L 27/322 |
| 2017/0012236 | A1* | 1/2017 | Yu | H01L 51/525 |
| 2017/0054109 | A1* | 2/2017 | Oh | H01L 51/5246 |
| 2017/0187000 | A1* | 6/2017 | Kato | H01L 27/3276 |
| 2017/0207413 | A1* | 7/2017 | Li | H01L 51/5259 |
| 2017/0213976 | A1* | 7/2017 | Luo | H01L 51/56 |
| 2017/0282495 | A1* | 10/2017 | Zhang | B32B 3/085 |
| 2017/0331072 | A1* | 11/2017 | Jo | H01L 51/5284 |
| 2018/0182984 | A1* | 6/2018 | Lim | H01L 51/0097 |
| 2018/0301512 | A1* | 10/2018 | Yu | H01L 27/32 |
| 2018/0342655 | A1* | 11/2018 | Cho | H01L 51/5259 |
| 2019/0097172 | A1* | 3/2019 | Wang | H01L 51/525 |
| 2019/0097174 | A1* | 3/2019 | Chen | H01L 51/5259 |
| 2019/0123297 | A1* | 4/2019 | Zhu | H01L 51/5259 |
| 2019/0165067 | A1* | 5/2019 | Kim | H01L 27/3246 |
| 2019/0198814 | A1* | 6/2019 | Ge | B01D 53/28 |
| 2019/0207153 | A1* | 7/2019 | Hou | H01L 51/5259 |
| 2019/0288233 | A1* | 9/2019 | Suzuki | H01L 51/5253 |
| 2019/0334113 | A1* | 10/2019 | Li | H01L 51/5096 |
| 2019/0334127 | A1* | 10/2019 | Li | H01L 51/5253 |
| 2020/0152908 | A1* | 5/2020 | Suzuki | H01L 51/5246 |
| 2021/0336207 | A1* | 10/2021 | Huang | H01L 51/56 |
| 2021/0343976 | A1* | 11/2021 | Miao | H01L 51/56 |
| 2021/0408446 | A1* | 12/2021 | Miao | H01L 51/5246 |

FOREIGN PATENT DOCUMENTS

| | | | | |
|---|---|---|---|---|
| CN | 104064683 | A | * 9/2014 | ........ H01L 51/5246 |
| CN | 104064683 | A | 9/2014 | |
| CN | 104362243 | A | 2/2015 | |
| CN | 105629593 | A | 6/2016 | |
| CN | 105810849 | A | 7/2016 | |
| CN | 105814970 | A | 7/2016 | |
| CN | 106784376 | A | 5/2017 | |
| CN | 106784376 | A | * 5/2017 | ............ H01L 27/32 |
| CN | 107359270 | A | * 11/2017 | ........ H01L 27/3244 |
| CN | 108054289 | A | * 5/2018 | ........ H01L 51/5253 |
| CN | 108054289 | A | 5/2018 | |
| CN | 108075049 | A | * 5/2018 | ........ H01L 51/5246 |
| CN | 109346622 | A | * 2/2019 | ........ H01L 51/5253 |
| CN | 109346622 | A | 2/2019 | |
| JP | 2004-311246 | A | * 11/2004 | ........... H01L 51/524 |
| JP | 2004-311246 | A | 11/2004 | |
| WO | WO 2006100444 | A1 | * 9/2006 | ........ H01L 51/5246 |

OTHER PUBLICATIONS

Machine translation, Bai, Chinese Pat. Pub. No. CN 107359270A, translation date: Sep. 22, 2021, Espacenet, all pages. (Year: 2021).*

Machine translation, Chen, Chinese Pat. Pub. No. CN 109346622A, translation date: Sep. 22, 2021, Espacenet, all pages. (Year: 2021).*

Machine translation, Kawasaki, Japanese Pat. Pub. No. JP 2004-311246A, translation date: Sep. 22, 2021, Espacenet, all pages. (Year: 2021).*

Machine translation, Ren, Chinese Pat. Pub. No. CN 108054289A, translation date: Sep. 22, 2021, Espacenet, all pages. (Year: 2021).*

Machine translation, Zhou, Chinese Pat. Pub. No. CN 104064683A, translation date: Sep. 22, 2021, Espacenet, all pages. (Year: 2021).*

Machine translation, Quan, Chinese Pat. Pub. No. CN 108075049A, translation date: Sep. 22, 2021, Espacenet, all pages. (Year: 2021).*

Office Action dated Jan. 20, 2021 issued in corresponding Chinese Application No. 201910726486.X.

* cited by examiner

COVER PLATE, DISPLAY PANEL, DISPLAY DEVICE AND METHOD FOR ENCAPSULATING DISPLAY PANEL

CROSS-REFERENCE TO RELATED APPLICATIONS

The present disclosure claims the priority of Chinese Patent Application NO. 201910726486.X, filed on Aug. 7, 2019, the contents of which are incorporated herein in their entirety by reference.

TECHNICAL FIELD

The present disclosure relates to the field of display technology, and in particular, relates to a cover plate, a display panel, a display device, and a method for encapsulating the display panel.

BACKGROUND

With vigorous development of display technology, organic light emitting diodes (OLEDs), which are current-driven light emitting devices, are increasingly applied to the field of high performance display due to their characteristics of self-luminescence, fast response, wide viewing angle, and capable of being used for flexible display.

A cover plate of a display panel in the related art generally includes a substrate, a barrier layer, and an encapsulation layer, but since the barrier layer and the encapsulation layer have limited water resistance, external water vapor may permeate into the display panel, thereby causing a problem of poor display of the display panel.

SUMMARY

The present disclosure provides a cover plate for encapsulating a display substrate, and the cover plate includes:

a base substrate including a display area and an encapsulation area arranged at a periphery of the display area; and an encapsulation layer, a first barrier layer, a water absorption layer and a second barrier layer arranged successively along a direction from the display area to the encapsulation area in the encapsulation area of the base substrate.

In some implementations, the water absorption layer includes a liquid desiccant or a solid desiccant.

In some implementations, at least one of the first barrier layer and the second barrier layer is doped with supporting particles.

In some implementations, both the first barrier layer and the second barrier layer are doped with supporting particles, and the supporting particles doped in the first barrier layer and the second barrier layer are different in size.

In some implementations, a size of each of the supporting particles doped in the first barrier layer is smaller than a size of each of the supporting particles doped in the second barrier layer.

In some implementations, a height of the first barrier layer is the same as a height of the second barrier layer.

The present disclosure further discloses a display panel, including a display substrate and the cover plate described above, which are opposite to each other and combined into the display panel.

The present disclosure further discloses a display device including the display panel.

The present disclosure further discloses a method for encapsulating a display panel, including:

providing a display substrate and a base substrate, wherein the base substrate includes a display area and an encapsulation area arranged at a periphery of the display area;

forming an encapsulation layer, a first barrier layer, a water absorption layer and a second barrier layer successively in the encapsulation area of the base substrate in a direction from the display area to the encapsulation area to obtain a cover plate;

performing a first curing on the cover plate to incompletely cure the encapsulation layer, the first barrier layer and the second barrier layer;

combining the display substrate to the cover plate; and performing a second curing on the display substrate and the cover plate which are combined to completely cure the encapsulation layer, the first barrier layer and the second barrier layer.

In some implementations, the forming the encapsulation layer, the first barrier layer, the water absorption layer and the second barrier layer successively in the direction from the display area to the encapsulation area in the encapsulation area of the base substrate to obtain the cover plate includes:

forming the encapsulation layer, the first barrier layer, the water absorption layer and the second barrier layer in the encapsulation area of the base substrate by using a coating process to obtain the cover plate.

DESCRIPTION OF EMBODIMENTS

In order to make features and advantages of the present disclosure more comprehensible, the present disclosure is described in further detail below with reference to accompanying drawings and detailed description.

Figure 1:
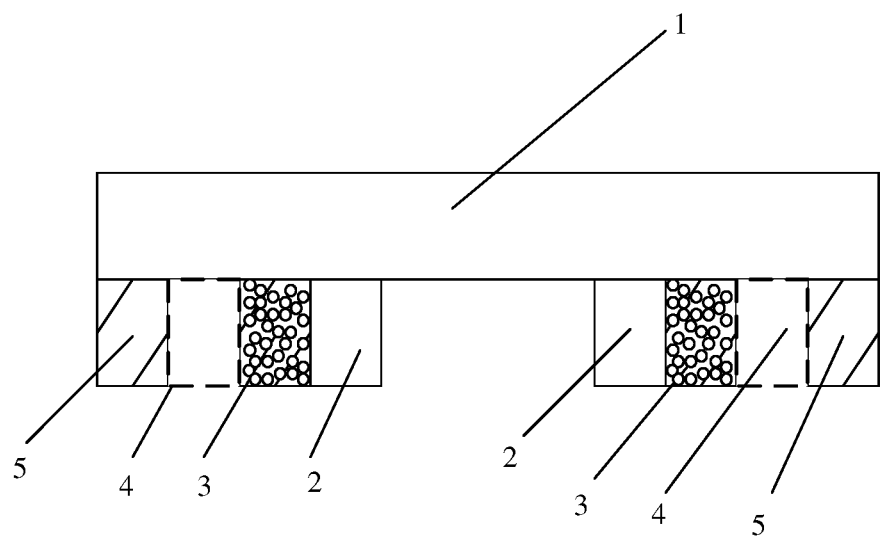
FIG. 1 is a schematic structural diagram of a cover plate for encapsulating a display substrate according to an embodiment of the present disclosure.
Figure 1A:
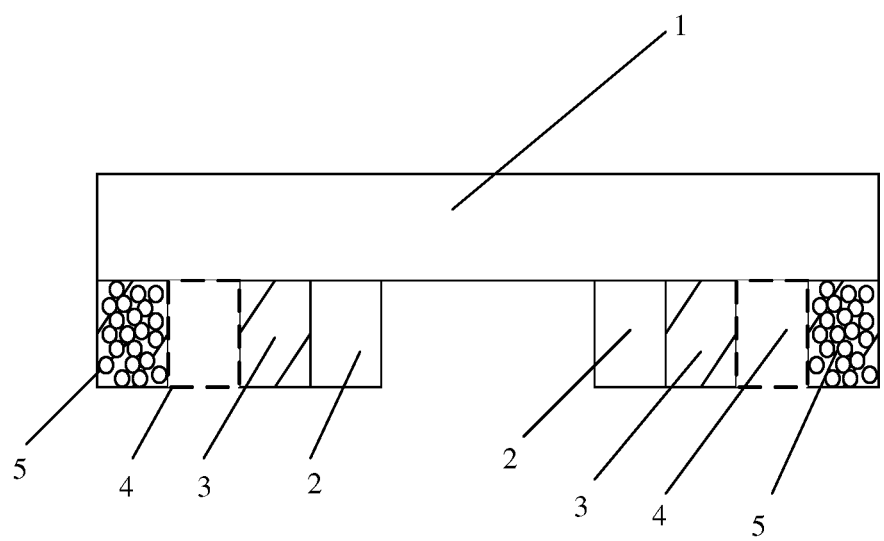
FIG. 1A is a schematic structural diagram of a cover plate for encapsulating a display substrate according to an embodiment of the present disclosure.

FIG. 1 shows a schematic structural diagram of a cover plate for encapsulating a display substrate according to an embodiment of the present disclosure, and as shown in FIG. 1, the cover plate includes a base substrate 1. The base substrate 1 includes a display area and an encapsulation area arranged at a periphery of the display area. In a direction from the display area to the encapsulation area, an encapsulation layer 2, a first barrier layer 3, a water absorption layer 4 and a second barrier layer 5 are successively arranged in the encapsulation area of the base substrate.

Specifically, in the direction from the display area to the encapsulation area, the encapsulation layer 2 may be formed in the encapsulation area of the base substrate first by using a coating process of a coating machine, and then the first barrier layer 3, the water absorption layer 4 and the second barrier layer 5 are formed by the coating machine.

In some implementations, the base substrate may be made of glass, plastic, or metal. Specifically, for a top-emission OLED display panel, a glass cover plate or a plastic substrate may be used for encapsulating to ensure that light emitted from the top-emission OLED display panel is not blocked, and for a bottom-emission OLED display panel, a glass substrate, a plastic substrate, or a metal substrate may be used.

The first barrier layer 3 and the second barrier layer 5 may be made of a compound including metal having a high thermal stability and a low resistivity, such as an oxide, a nitride, or an oxynitride.

The first barrier layer 3 and the second barrier layer 5 may also be made of metal having a high thermal stability and a low resistivity, such as molybdenum, titanium, tungsten, tantalum, zirconium, cobalt, hafnium, or the like.

In some implementations, the water absorption layer 4 may be made of a liquid desiccant or a solid desiccant. The solid desiccant may be calcium oxide or barium oxide, and the liquid desiccant may be calcium oxide solution or barium oxide solution, however, those skilled in the art may use any other available material to form the water absorption layer 4, such as an alloy of zirconium, cobalt, and a rare earth metal, and the like, and the present disclosure is not limited thereto.

In some implementations, in order to make heights of the first barrier layer 3 and the second barrier layer 5 consistent, at least one of the first barrier layer 3 and the second barrier layer 5 may be doped with supporting particles so as to maintain thicknesses of the first barrier layer 3 and the second barrier layer 5.

Alternatively, in order to make the heights of the first barrier layer 3 and the second barrier layer 5 consistent, both the first barrier layer 3 and the second barrier layer 5 may be doped with supporting particles, and the supporting particles doped in the first barrier layer 3 and the second barrier layer 5 may have different sizes.

The heights of the first barrier layer 3 and the second barrier layer 5 refer to the heights of the first barrier layer 3 and the second barrier layer 5 after the cover plate and the display substrate are combined into a display panel. The size of the supporting particle refers to a diameter of each of the supporting particles.

In particular, the size of each of the supporting particles doped in the first barrier layer 3 may be smaller than the size of each of the supporting particles doped in the second barrier layer 5.

For example, the diameter of each of the supporting particles in the first barrier layer 3 of the present disclosure may be 9 μm, and the diameter of each of the supporting particles in the second barrier layer 5 may be 10 μm.

It should be noted that the diameter of each of the supporting particles and the value thereof are only exemplary, and in practices, the size of each of the supporting particles may be adjusted according to actual requirements.

In the embodiment, in the direction from the display area to the encapsulation area, the encapsulation layer 2, the first barrier layer 3, the water absorption layer 4 and the second barrier layer 5 are successively arranged, compared with that only the encapsulation layer and one barrier layer (for example, the encapsulation layer 2 and the second barrier layer 5) are arranged, the water absorption layer 4 can further absorb external water vapor effectively, and the cover plate and the display substrate can be combined hermetically, thereby avoiding a problem of poor display of the display panel caused by water vapor, the first barrier layer 3 can avoid interpenetration between the water absorption layer 4 and the encapsulation layer 2, thereby preventing air bubbles from being generated, and therefore a good encapsulation effect between the cover plate and the display substrate is achieved.

Figure 2:
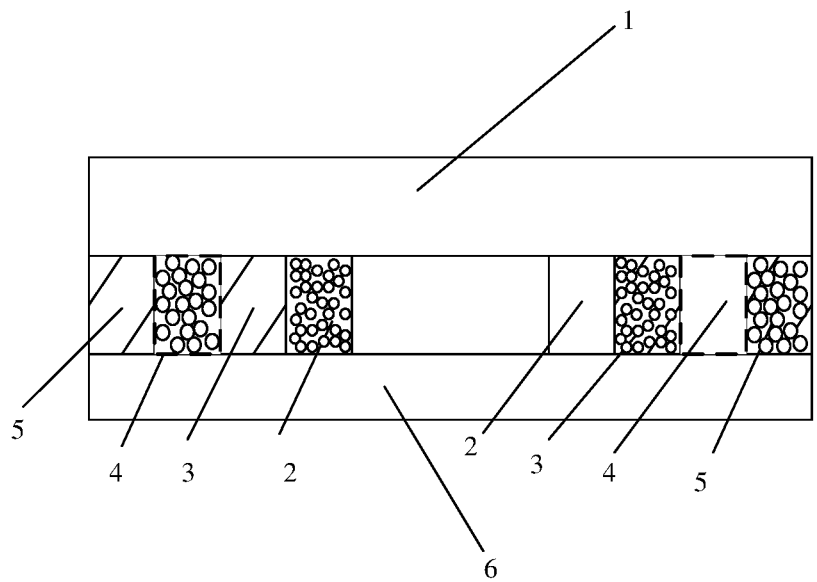
FIG. 2 is a schematic structural diagram of a display panel according to an embodiment of the present disclosure.

The present disclosure further discloses a display panel, including a display substrate 6 and the cover plate in above embodiment, which are arranged opposite to each other and are combined into the display panel, as shown in FIG. 2.

The display panel has all advantages of the cover plate in the above embodiment, and the description thereof is omitted here.

The present disclosure further discloses a display device including the display panel in above embodiment.

The display device has all advantages of the display panel in the above embodiment, and the description thereof is omitted here.

Figure 3:
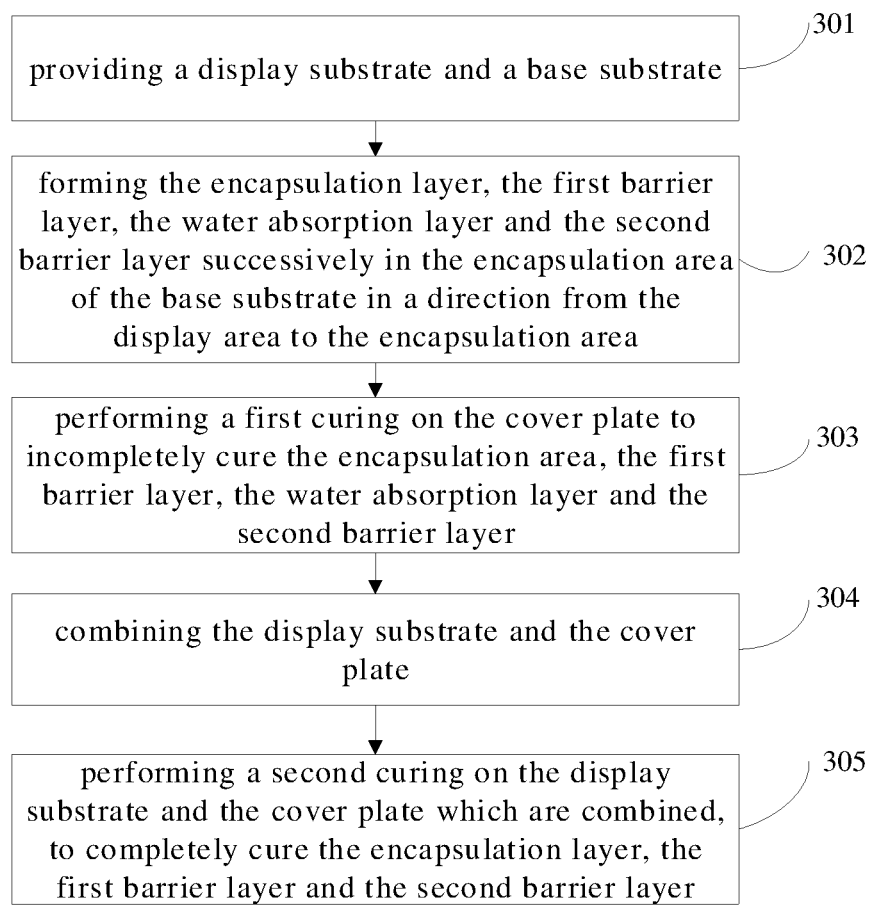
FIG. 3 is a flowchart illustrating a method for encapsulating a display panel according to an embodiment of the present disclosure.

FIG. 3 is a flowchart illustrating a method for encapsulating a display panel according to an embodiment of the present disclosure. The method includes steps 301 to 305, as illustrated in FIG. 3.

Step 301: providing a display substrate and a base substrate.

The base substrate includes a display area and an encapsulation area arranged at a periphery of the display area.

Step 302: forming a first barrier layer, a second barrier layer, a water absorption layer and an encapsulation layer in the encapsulation area of the base substrate to obtain a cover plate.

Specifically, in a direction from the display area to the encapsulation area, the encapsulation layer, the first barrier layer, the water absorption layer, and the second barrier layer are successively formed in the encapsulation area of the base substrate.

For example, the encapsulation layer is first formed in the encapsulation are of the base substrate by using a coating process of a coating machine.

Then, the first barrier layer is formed by using the coating process of the coating machine, and supporting particles are doped in the first barrier layer, so that the first barrier layer has a certain thickness, and a contact between the cover plate and the display substrate is avoided.

Subsequently, the water absorption layer is formed by using the coating process of the coating machine.

Finally, the second barrier layer is formed by using the coating process of the coating machine, and supporting particles are adopted in the second barrier layer, so that the second barrier layer has a certain thickness, and a contact between the cover plate and the display substrate is avoided.

Step 303: performing a first curing on the cover plate.

After the encapsulation layer, the first barrier layer, and the second barrier layer are formed in step 302, UV irradiation may be used to incompletely cure the encapsulation layer, the first barrier layer, and the second barrier layer of the cover plate.

Step 304: combining the display substrate and the cover plate into the display panel.

Step 305: performing a second curing on the display substrate and the cover plate which are combined, to completely cure the encapsulation layer, the first barrier layer and the second barrier layer.

For example, the display substrate and the cover plate, which are combined, are baked by using a heating furnace, so that the encapsulation layer, the first barrier layer and the second barrier layer are completely cured, and an encapsulation of the display panel is completed.

In the embodiment, in the direction form the display area to the encapsulation area, the encapsulation layer, the first barrier layer, the water absorption layer and the second barrier layer are formed successively, compared with that only the encapsulation layer and one barrier layer (for example, the encapsulation layer and the second barrier layer) are formed, the water absorption layer can further absorb external water vapor effectively, and the cover plate and the display substrate can be combined hermetically, thereby avoiding a problem of poor display of the display panel caused by water vapor, the first barrier layer can avoid interpenetration between the water absorption layer and the encapsulation layer, thereby preventing air bubbles from being generated, and therefore a good encapsulation effect between the cover plate and the display substrate is achieved.

It should be noted that, for simplicity of description, the above method is described as a series of steps, but those skilled in the art should understand that the present disclosure is not limited by the described order of the steps, because some steps may be performed in another order or simultaneously according to the present disclosure. Further, those skilled in the art should understand that the embodiments described in the present disclosure are exemplary embodiments and that not all the steps are necessarily required for the present disclosure.

The embodiments in the present disclosure are described in a progressive manner, and each embodiment focuses on differences from other embodiments, and similar or identical parts in the embodiments are referred to each other.

Those skilled in the art should further understand that any combination of the above embodiments is possible, and therefore, is a technical solution of the present disclosure, but it is not detailed here due to space limitation.

While example embodiments of the present disclosure have been described, variations and modifications of these embodiments are conceivable to those skilled in the art once they learn of concepts of the present disclosure. Therefore, it is intended that appended claims should be interpreted as including the exemplary embodiments and all variations and modifications falling within the scope of the present disclosure.

The cover plate, the display panel, the display device and the method for encapsulating the display panel provided by the present disclosure are described in detail above, and specific examples are applied here to explain principles and implementations of the present disclosure, and the description of the above examples is only used to help to understand the method and the core idea of the present disclosure; meanwhile, for those skilled in the art, specific implementations and the application range can be change according to the core idea of the present disclosure, and in view of the above, the content of the present disclosure should not be construed as limiting the present disclosure.

The invention claimed is:

1. A cover plate for encapsulating a display substrate, comprising:
    a base substrate comprising a display area and an encapsulation area arranged at a periphery of the display area; and
    an encapsulation layer, a first barrier layer, a water absorption layer, and a second barrier layer successively arranged in the encapsulation area in a direction from the display area to the encapsulation area,
    wherein at least one of the first barrier layer and the second barrier layer is doped with supporting particles.

2. The cover plate of claim 1, wherein the water absorption layer comprises a liquid desiccant or a solid desiccant.

3. The cover plate of claim 1, wherein both the first barrier layer and the second barrier layer are doped with supporting particles, and the supporting particles doped in the first barrier layer are different from the supporting particles doped in the second barrier layer in size.

4. The cover plate of claim 3, wherein a size of each of the supporting particles doped in the first barrier layer is smaller than a size of each of the supporting particles doped in the second barrier layer.

5. The cover plate of claim 1, wherein a height of the first barrier layer is same as a height of the second barrier layer.

6. A display panel, comprising a display substrate and the cover plate of claim 1,
    wherein the display substrate and the cover plate are opposite to each other and combined into the display panel.

7. A display device, comprising the display panel of claim 6.

8. A method for encapsulating a display panel, comprising:
    providing a display substrate and a base substrate, wherein the base substrate comprises a display area and an encapsulation area arranged at a periphery of the display area;
    forming an encapsulation layer, a first barrier layer, a water absorption layer, and a second barrier layer successively in the encapsulation area of the base substrate in a direction from the display area to the encapsulation area to obtain a cover plate;
    performing a first curing on the cover plate to incompletely cure the encapsulation layer, the first barrier layer, and the second barrier layer;
    combining the display substrate and the cover plate; and
    performing a second curing on the display substrate and the cover plate which are combined to completely cure the encapsulation layer, the first barrier layer, and the second barrier layer.

9. The method of claim 8, wherein forming the encapsulation layer, the first barrier layer, the water absorption layer, and the second barrier layer successively in the encapsulation area of the base substrate in the direction from the display area to the encapsulation area to obtain the cover plate comprises:
    forming the encapsulation layer, the first barrier layer, the water absorption layer, and the second barrier layer in the encapsulation area of the base substrate by using a coating process to obtain the cover plate.

* * * * *